(12) United States Patent
Sekiya

(10) Patent No.: US 10,964,567 B2
(45) Date of Patent: Mar. 30, 2021

(54) PROCESSING APPARATUS

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 204 days.

(21) Appl. No.: 15/725,443

(22) Filed: Oct. 5, 2017

(65) Prior Publication Data

US 2018/0102268 A1 Apr. 12, 2018

(30) Foreign Application Priority Data

Oct. 7, 2016 (JP) .............................. JP2016-198614

(51) Int. Cl.
| | | |
|---|---|---|
| *H01L 21/677* | (2006.01) | |
| *H01L 21/67* | (2006.01) | |
| *H01L 21/68* | (2006.01) | |
| *H01L 21/66* | (2006.01) | |

(52) U.S. Cl.
CPC .. *H01L 21/67288* (2013.01); *H01L 21/67173* (2013.01); *H01L 21/67766* (2013.01); *H01L 21/67778* (2013.01); *H01L 21/681* (2013.01); *H01L 22/20* (2013.01); *H01L 22/12* (2013.01)

(58) Field of Classification Search
None
See application file for complete search history.

(56) References Cited

U.S. PATENT DOCUMENTS

| | | | | |
|---|---|---|---|---|
| 6,286,685 B1 * | 9/2001 | Kononchuk | ...... | H01L 21/67271 209/2 |
| 6,324,298 B1 * | 11/2001 | O'Dell | ............... | G01N 21/9501 257/E21.53 |
| 2002/0193899 A1 * | 12/2002 | Shanmugasundram | ..................... | B24B 37/013 700/108 |
| 2008/0254715 A1 * | 10/2008 | Sekiya | .................... | B24B 7/228 451/10 |
| 2015/0377796 A1 * | 12/2015 | Schlezinger | ............ | H02S 50/00 356/72 |

FOREIGN PATENT DOCUMENTS

| JP | 2015-008195 | 1/2015 |
|---|---|---|
| JP | 2015008195 | 1/2015 |

OTHER PUBLICATIONS

Odaira, Satoshi, U.S. Appl. No. 15/880,642, filed Jan. 26, 2018.

* cited by examiner

*Primary Examiner* — Michael S Lowe
(74) *Attorney, Agent, or Firm* — Greer Burns & Crain, Ltd.

(57) ABSTRACT

Disclosed herein is a processing apparatus including a wafer testing unit for testing whether or not a wafer carried from a cassette mount unit is a wafer corresponding to a processing condition. The wafer testing unit measures characteristics of the carried wafer by a measuring section, and a determining section of a control unit compares actual measurements of the wafer characteristics measured by the measuring section with setpoints of wafer characteristics corresponding to the processing condition, to thereby determine conformability of the carried wafer. When it is determined by the determining section that the carried wafer is a wafer corresponding to the processing condition, the wafer is carried to a processing unit and processed. When it is determined by the determining section that the carried wafer is not a wafer corresponding to the processing condition, an error is notified by a notifying section.

3 Claims, 2 Drawing Sheets

PROCESSING APPARATUS

BACKGROUND OF THE INVENTION

Field of the Invention

The present invention relates to a processing apparatus for processing a wafer.

Description of the Related Art

In a manufacturing process of a semiconductor device or an electronic part, a plate-shaped workpiece formed of one of various materials such as a semiconductor wafer or a ceramic substrate is thinned to a predetermined thickness by a grinding apparatus or a polishing apparatus, and is thereafter divided along division lines (streets) into individual device chips, by a cutting blade mounted to a spindle of a cutting apparatus or by a laser processing apparatus. In recent years, attendant on diversification of the processing mode (thinning, etc.) for the workpiece, a wafer processing apparatus in which a variety of processing apparatuses are freely combined and used in cooperation (cluster module system) has been proposed (see Japanese Patent Laid-Open No. 2015-8195). In the cluster module system, processing of a variety of device wafers can be carried out concurrently.

SUMMARY OF THE INVENTION

However, in the case of simultaneously processing a variety of wafers associated with different processing conditions, a wafer not conforming to a preset processing condition may be fed to processing. When such an erroneous feeding of an inappropriate wafer to processing is generated, it may be impossible to perform appropriate processing, so that defective processing and a defective product may be generated, or the processing operation must be interrupted, leading to a time loss. As a result, bad influences may be exerted on productivity and cost.

Accordingly, it is an object of the present invention to provide a processing apparatus which can avoid generation of a defective product due to erroneous feeding of an inappropriate wafer to processing.

In accordance with an aspect of the present invention, there is provided a processing apparatus including a cassette mount unit on which a cassette accommodating a plurality of wafers is mounted, a carrying-out unit that carries out the wafer from the cassette mounted on the cassette mount unit, a carrying unit that carries the wafer carried out by the carrying-out unit, a plurality of processing units which are disposed adjacently to the carrying unit and which individually apply different processing to the wafer, a control unit that controls each of the units, the control unit including a storage section preliminarily storing a processing condition set correspondingly to wafer characteristics including at least wafer thickness and wafer outside diameter, and a wafer testing unit which is disposed adjacently to the carrying unit and which performs a test for determining whether or not the wafer carried by the carrying unit is a wafer corresponding to the processing condition. The wafer testing unit includes a holding table for holding the wafer carried from the carrying unit, and measuring means for measuring the wafer characteristics of the wafer held by the holding table. The control unit includes a determining section which compares actual measurements of the wafer characteristics measured by the measuring means with setpoints of wafer characteristics corresponding to the processing condition, to thereby determine whether or not the carried wafer is a wafer corresponding to the processing condition. When it is determined by the determining section that the carried wafer is a wafer corresponding to the processing condition, the wafer is carried to the processing unit and processed, whereas when it is determined by the determining section that the carried wafer is not a wafer corresponding to the processing condition, an error is notified by notifying means.

According to this configuration, the processing at the processing unit is performed only when the carried wafer has the wafer characteristics corresponding to the processing condition, and an error is notified when the carried wafer does not have the wafer characteristics corresponding to the processing condition. Therefore, there is no possibility of an erroneously fed wafer being processed as it is.

Preferably, the wafer characteristics referred to at the time of determining whether or not the carried wafer is a wafer corresponding to the processing condition include any one of wafer outside diameter, wafer thickness, index size, and an alignment key pattern image.

Preferably, the processing apparatus further includes a mount table for mounting on an upper surface thereof the wafer carried by the carrying unit, and center aligning means for aligning a center of the wafer, the center aligning means having at least three contact portions movable in radial directions with the mount table as a center. The center aligning means functions also as the wafer testing unit, and includes measuring means for measuring the wafer characteristics of the wafer mounted on the mount table, and the wafer mounted on the mount table undergoes center alignment by the contact portions, and the wafer characteristics are measured by the measuring means.

According to the present invention, it is possible to provide a processing apparatus which can obviate generation of a defective product due to erroneous feeding of an inappropriate wafer to processing.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
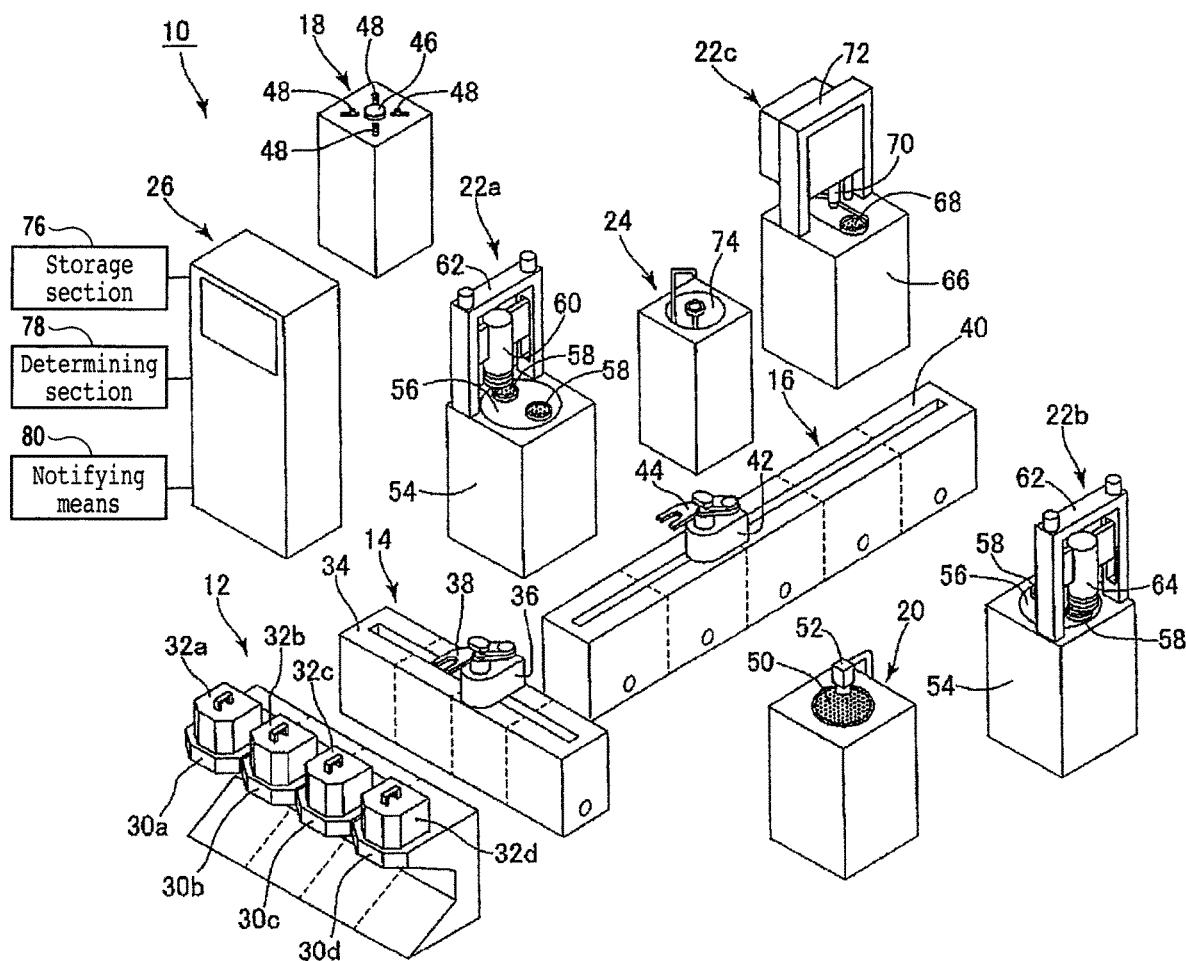
FIG. 1 is a perspective view depicting a wafer processing apparatus according to an embodiment of the present invention, in its state of being disassembled into units.
Figure 2:
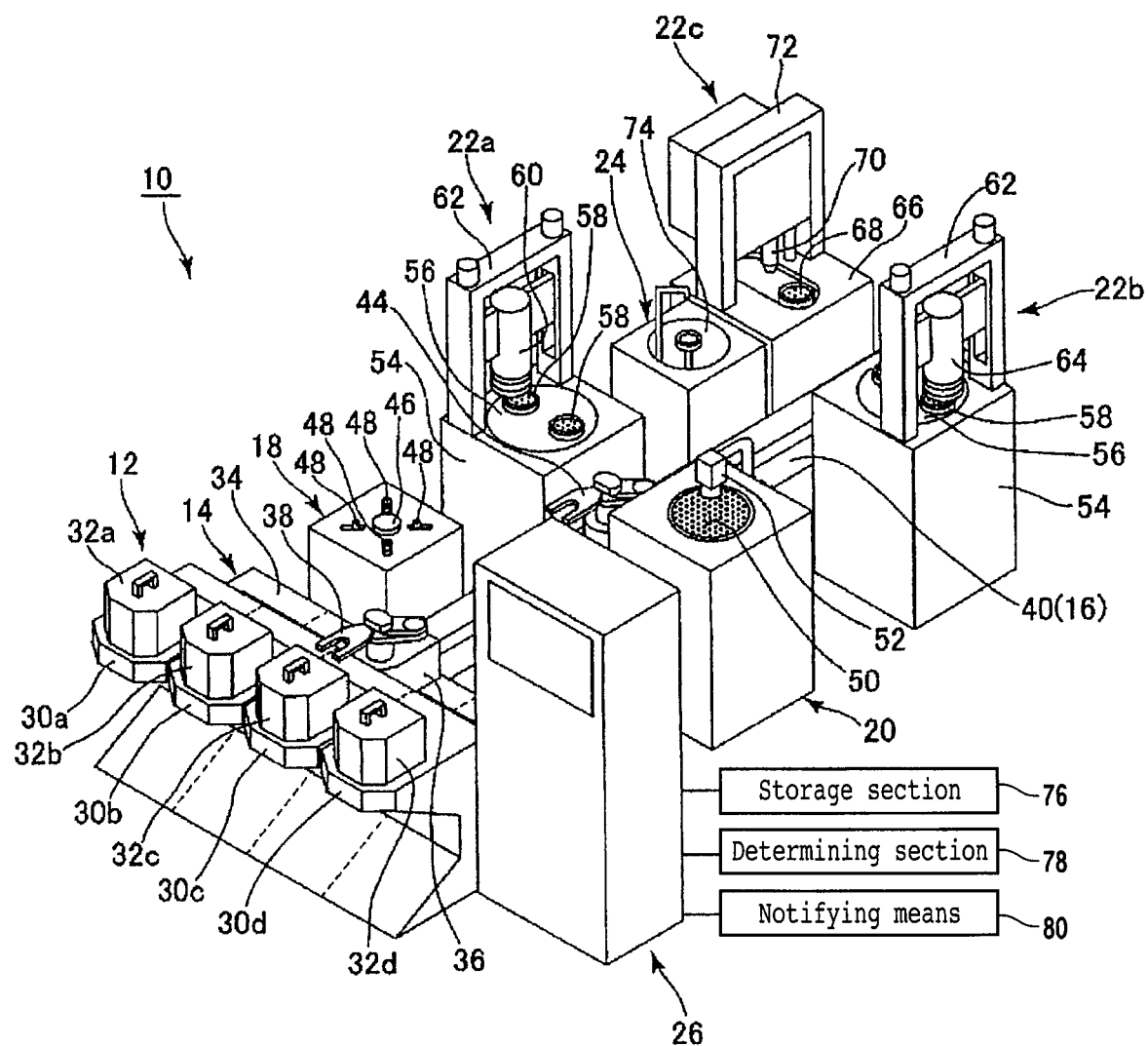
FIG. 2 is a perspective view of the wafer processing apparatus according to the embodiment, in a state where the units are combined.

A processing apparatus according to an embodiment of the present invention will be described below, referring to the attached drawings. FIG. 1 depicts a wafer processing apparatus 10 in its state of being disassembled into units, and FIG. 2 depicts the wafer processing apparatus 10 in a state where the units are combined. The wafer processing apparatus 10 includes a cassette mount unit 12, a carrying-out unit 14, a carrying unit 16, a center aligning unit 18, a wafer testing unit 20, a plurality of processing units 22a, 22b, and 22c, a cleaning unit 24, and a control unit 26.

The cassette mount unit 12 includes a plurality of cassette mount tables 30a, 30b, 30c, and 30d aligned in a row, and cassettes 32a, 32b, 32c, and 32d mounted individually on the cassette mount tables 30a, 30b, 30c, and 30d. In each of the cassettes 32a, 32b, 32c, and 32d, a plurality of wafers can be accommodated.

The carrying-out unit 14 includes a guide rail 34 extending substantially in parallel to the direction in which the plurality of cassette mounting tables 30a, 30b, 30c, and 30d are aligned in the cassette mount unit 12, moving means 36 supported so as to be movable along the guide rail 34, and wafer holding means 38 which is supported by the moving means 36 and capable of holding the wafer. The guide rail 34 is configured by combining a plurality of rail units divided in the longitudinal direction, and boundary portions of the rail units are indicated by broken lines in FIG. 1. In the present embodiment, the guide rail 34 is composed of two end rail units and two intermediate rail units. The moving means 36 is supported so as to be movable in the longitudinal direction of the guide rail 34, and is moved by a driving force of a linear motor incorporated therein. The wafer holding means 38 is composed of a multiaxial joint robot provided at its tip with a hand for holding the wafer. With the moving means 36 and the wafer holding means 38 operated, it is possible to carry out the wafers accommodated in each of the cassettes 32a, 32b, 32c, and 32d, and to accommodate the wafers into each of the cassettes 32a, 32b, 32c, and 32d.

The carrying unit 16 includes a guide rail 40 extending in a direction perpendicular to the longitudinal direction of the guide rail 34 of the carrying-out unit 14, moving means 42 supported so as to be movable along the guide rail 40, and wafer holding means 44 which is supported by the moving means 42 and capable of holding the wafer. The guide rail 40 is configured by combining a plurality of rail units divided in the longitudinal direction, and boundary portions of the rail units are indicated by broken lines in FIG. 1. In the present embodiment, the guide rail 40 is composed of two end rail units and three intermediate rail units. The moving means 42 is supported so as to be movable in the longitudinal direction of the guide rail 40, and is moved by a driving force of a linear motor incorporated therein. The wafer holding means 44 is composed of a multiaxial joint robot provided at its tip with a hand for holding the wafer.

The center aligning unit 18 includes a mount table 46 capable of holding the wafer on an upper surface thereof, and four contact portions 48 movable in radial directions with the mount table 46 as a center. Each of the contact portions 48 is composed of a cylindrical pin, and, with the four contact portions 48 moved toward the radial center, center alignment of the wafer mounted on the upper surface of the mount table 46 is conducted.

The wafer testing unit 20 includes a holding table 50 capable of holding the wafer on an upper surface thereof, and measuring means 52 for measuring characteristics of the wafer held on the holding table 50. The wafer characteristics measured by the measuring means 52 include any one of wafer outside diameter, wafer thickness, index size (the size between adjacent division lines) on wafer, and an alignment key pattern image.

In the case where an object to be measured by the wafer testing unit 20 is wafer outside diameter, an imaging apparatus capable of imaging the wafer as a whole can be used as the measuring means 52. The height position and imaging magnification of the imaging apparatus are so set that an image of the whole body of the substantially circular wafer held on the holding table 50 is contained in a screen, and the center of the wafer is identified from the image. For example, a virtual isosceles triangle having three vertexes on the circumference of the imaged wafer is set, and a bisector of the apical angle is drawn. When two or more such bisectors which are in a non-parallel relation are drawn, the intersection of the bisectors is the center of the wafer. The distance between two intersections where a straight line passing through the center of the wafer intersects the circumference of the wafer on the image is determined, and a measured value of the wafer outside diameter is obtained based on this distance.

In the case where an object to be measured by the wafer testing unit 20 is wafer thickness, a contact type gauge or a non-contact type height sensor can be used as the measuring means 52. In the case of the contact type gauge, the gauge is put in contact with an upper surface of the holding table 50 and with an upper surface (which may be a front surface or a back surface that faces upward) of the wafer held on the holding table 50, and a measured value of wafer thickness is obtained from the difference in height direction between the upper surfaces. In the case of the non-contact type height sensor, measuring light is applied to the wafer from above, and a measured value of wafer thickness is obtained based on the difference in optical path length between reflected light reflected on the upper surface of the wafer and reflected light reflected on the lower surface of the wafer after being transmitted through the wafer. For example, in the case of measuring by the non-contact type height sensor the thickness of a wafer with a protective tape adhered to a front surface thereof, the wafer is mounted on the holding table 50 with the surface with the protective tape directed down (directed to face the upper surface of the holding table 50), and measuring light consisting of infrared (IR) rays is applied to the wafer from the side of the wafer back surface directed upward. An IR camera capable of imaging an IR image of the wafer through the wafer is disposed above the wafer, and reflected light reflected from the back surface (upper surface) of the wafer and reflected light reflected from the front surface (lower surface) of the wafer are received by the IR camera, whereby the thickness of the wafer can be measured.

In the case where an object to be measured by the wafer testing unit 20 is index size (the size between adjacent division lines) on wafer, an imaging apparatus can be used as the measuring means 52. The division lines corresponding to individual device chips and an alignment key pattern or the like are formed on the wafer, so that by imaging the adjacent division lines or the key pattern or the like by the imaging apparatus and performing length measurement, a measured value of index size is obtained.

In the case where an object to be measured by the wafer testing unit 20 is an alignment key pattern image, an imaging apparatus for imaging the alignment key pattern image can be used as the measuring means 52. For example, the imaging apparatus images the wafer at a low magnification to acquire a macro key pattern image, and images the wafer at a high magnification to acquire a micro key pattern image. The plurality of means described above as examples may be jointly used as the measuring means 52 of the wafer testing unit 20, to thereby measure a plurality of kinds of wafer characteristics.

In the present embodiment, the plurality of processing units 22a, 22b, and 22c consist of a rough grinding unit 22a, a finish grinding unit 22b, and a laser processing unit 22c. The rough grinding unit 22a includes a turntable 56 supported on a unit housing 54 so as to be rotatable, two chuck tables 58 supported on the turntable 56, rough grinding means 60 located on the upper side of the turntable 56, and support means 62 for supporting the rough grinding means 60. By rotating the turntable 56, the two chuck tables 58 can be alternately positioned in a processing region under the rough grinding means 60 and a wafer attachment/detachment region near the guide rail 40 of the carrying unit 16. The two chuck tables 58 can each hold the wafer on an upper surface thereof by suction. The rough grinding means 60 is supported by the support means 62 so as to be movable vertically, and applies rough grinding to the wafer on the chuck table 58 by a grindstone or grindstones. The finish grinding unit 22b has a common mechanism with the rough grinding unit 22a except that it has finish grinding means 64 in place of the rough grinding means 60; therefore, the common elements with the rough grinding unit 22a are denoted by the same reference symbols as used above and descriptions of them are omitted. The finish grinding unit 22b applies finish grinding to the wafer held on the chuck table 58 by a grindstone or grindstones provided in the finish grinding means 64.

The laser processing unit 22c includes a chuck table 68 supported on a unit housing 66, laser beam applying means 70 located on the upper side of the chuck table 68, and support means 72 supporting the laser beam applying means 70. The laser beam applying means 70 is supported by the support means 72 so as to be movable. The chuck table 68 can be moved in a processing feed direction relative to the laser beam applying means 70, and is capable of holding the wafer on an upper surface thereof by suction. The laser processing unit 22c applies a laser beam to the wafer held on the chuck table 68 by the laser beam applying means 70, thereby applying predetermined laser processing to the wafer. The cleaning unit 24 includes known spinner type cleaning means, and perform spinner cleaning of the wafer carried into a cleaning region 74.

In a state where the units constituting the wafer processing apparatus 10 are combined as depicted in FIG. 2, the center aligning unit 18, the wafer testing unit 20, the plurality of processing units 22a, 22b, and 22c, and the cleaning unit 24 are all disposed adjacent to the guide rail 40 of the carrying unit 16. In addition, the center aligning unit 18 is adjacent also to the guide rail 34 of the carrying-out unit 14. The wafer can be carried to each of the units through the carrying-out unit 14 and the carrying unit 16.

Each of the cassette mount unit 12, the carrying-out unit 14, the carrying unit 16, the center aligning unit 18, the wafer testing unit 20, the rough grinding unit 22a, the finish grinding unit 22b, the laser processing unit 22c, and the cleaning unit 24 is provided with control means for controlling its own operation or working. The control unit 26 transfers control signals between itself and the control means of the units, thereby totally controlling the wafer processing apparatus 10.

The control unit 26 includes a storage section 76 and a determining section 78. Processing conditions for the wafers to be dealt with by the wafer processing apparatus 10 are stored in the storage section 76. The processing conditions include conditions needed from the start to the end of processing, such as a wafer carrying route (the order of carrying between the units) in the wafer processing apparatus 10, the above-mentioned wafer characteristics (wafer outside diameter, wafer thickness, index size, an alignment key pattern image, etc.), cleaning conditions, and the like. The processing conditions differ on the basis of the device to be manufactured, and a plurality of sets of processing conditions corresponding to a plurality of kinds of devices are managed in the state of being given identification information such as device data number.

The determining section 78 of the control unit 26 compares the wafer characteristics measured by the measuring means 52 of the wafer testing unit 20 with wafer characteristic setpoints included in the processing condition stored in the storage section 76 to find a correlation therebetween, thereby determining whether both of them correspond to each other. For example, in the case where at least one of wafer outside diameter, wafer thickness, and index size on wafer is measured by the measuring means 52 of the wafer testing unit 20, it is determined whether or not the actual measurement or measurements of the at least one are within predetermined allowable ranges in relation to numerical values of wafer outside diameter, wafer thickness, and index size included as setpoints in the processing condition. In addition, in the case where an alignment key pattern image on the wafer is acquired by the measuring means 52 of the wafer testing unit 20, the degree of similarity between the alignment key pattern image thus picked up and a reference pattern included in the processing condition is determined, and it is determined whether or not the degree of similarity is not less than a predetermined degree. Note that as the reference pattern, one that is preset by an operator's teaching process may be used.

The wafer processing apparatus 10 further includes notifying means 80. The notifying means 80 is controlled by the control unit 26, and notifies an error state (which will be described later) by use of visual information or aural information.

An operation of the wafer processing apparatus 10 configured as above will now be described. In performing a processing operation by the wafer processing apparatus 10, wafers yet to be processed are accommodated in part of or all of the cassettes 32a, 32b, 32c, and 32d. In each of the cassettes 32a, 32b, 32c, and 32d, there may be accommodated a plurality of wafers of the same kind which have common wafer characteristics, or a plurality of wafers of multiple kinds which are different in wafer characteristics. In either case, processing conditions corresponding to characteristics of each of the wafers yet to be processed which are accommodated in each of the cassettes 32a, 32b, 32c, and 32d are inputted to the control unit 26 by an operator, and are held as data in the storage section 76.

When a processing starting signal for a predetermined wafer is inputted by the operator, the relevant wafer is carried out from the cassette 32a, 32b, 32c, or 32d by the carrying-out unit 14, and is carried to the center aligning unit 18. Center alignment is conducted at the center aligning unit 18, and the wafer having undergone the center alignment is carried to the wafer testing unit 20 by the carrying unit 16.

The wafer testing unit 20 measures wafer characteristics of the wafer held on the upper surface of the holding table 50 by the measuring means 52. The determining section 78 of the control unit 26 compares the actual measurements of wafer characteristics measured by the measuring means 52 with setpoints of wafer characteristics corresponding to a processing condition that are prestored in the storage section 76, and determines whether or not the wafer carried onto the holding table 50 is a wafer corresponding to the processing condition. In the case where it is determined by the determining section 78 that the wafer is an appropriate one corresponding to the processing condition, the control proceeds to a processing step which will be described later. In the case where it is determined by the determining section 78 that the wafer is an inappropriate one not corresponding to the processing condition, the control process does not proceed to the processing step, and an error processing is conducted.

In the error processing, an error is notified by the notifying means 80. The contents of the notification can be arbitrarily selected according to the configuration of the notifying means 80. As the notifying means 80, there can be used, for example, a display for notifying an error as character information or image information, a light-emitting diode (LED) or light bulb for notifying an error as light emission information, a speaker for notifying an error as aural information and the like, and a combination thereof. In the error processing, further, the wafer determined not to correspond to the processing condition is removed from the carrying route by, for example, returning the wafer to the cassette 32*a*, 32*b*, 32*c*, or 32*d* in which the wafer has initially been accommodated, by use of the carrying unit 16 and the carrying-out unit 14.

In the case where the wafer is determined by the determining section 78 to be an appropriate wafer corresponding to the processing condition and the control process proceeds to the processing step, the control unit 26 carries the wafer along a predetermined carrying route contained in the processing condition, by use of the carrying unit 16. To which of the rough grinding unit 22*a*, the finish grinding unit 22*b*, the laser processing unit 22*c*, and the cleaning unit 24 and in what order the wafer is to be carried differ depending on the processing condition. When an operation at each unit is completed and an operation completion signal is sent, the control unit 26 sends to the carrying unit 16 a carrying command signal for carrying the wafer to the next unit, and the wafer having undergone each processing step is carried. The wafer for which all the processing included in the processing condition have been completed is carried to the center aligning unit 18, where center alignment is conducted, after which the wafer is accommodated into a predetermined position in a predetermined one of the cassettes 32*a*, 32*b*, 32*c*, and 32*d* by the carrying-out unit 14.

While a flow of processing of a single wafer has been described above, a plurality of wafers can be processed in a continuous manner by sequentially carrying out the wafers from the cassettes 32*a*, 32*b*, 32*c*, and 32*d* when the operation at each unit is finished.

As has been described above, in the wafer processing apparatus 10 in the present embodiment, the actual measurements of wafer characteristics measured by the wafer testing unit 20 and the setpoints of wafer characteristics corresponding to the processing condition are compared, and it is determined whether or not a wafer corresponding to the processing condition is being actually carried. In the case where it is determined that the wafer being carried is a wafer not conforming to the processing condition, an error notification by the notifying means 80 is performed. This makes it possible to prevent a wafer not conforming to the processing condition from being processed by each of the processing units 22*a*, 22*b*, and 22*c*.

Particularly, in a cluster module system which includes a plurality of processing units and in which a variety of wafers differing in processing condition can be processed simultaneously as in the wafer processing apparatus 10, it is indispensable, for performing processing according to the processing condition, to appropriately set accommodating positions of the wafers in each cassette and the relative layout of the plurality of cassettes accommodating the wafers therein. In the wafer processing apparatus 10 in the present embodiment, it is possible to determine easily and securely whether or not the wafer about to be fed to processing is a wafer of an appropriate kind that has been accommodated in an appropriate accommodation position. This determination is different from a simple article inspection work for finding a defective product from among a plurality of wafers which have the same processing condition, and removing the defective product. Specifically, the processing apparatus to which the present invention has been applied can securely solve the problem, peculiar to a cluster module system, of erroneous feeding of an inappropriate wafer to processing that may arise from the mixed presence of a variety of wafers.

As a configuration different from the wafer processing apparatus 10 of the present embodiment, there may also be adopted a configuration wherein the center aligning unit 18 functions also as a wafer testing unit. The center aligning unit 18 can measure the outside diameter of a wafer by use of four contact portions 48 at the time of performing center alignment for the wafer. In the case where the center aligning unit 18 functions also as the wafer testing unit, the wafer testing unit 20 in the above-described embodiment can be omitted. Note that while the center aligning unit 18 in the above embodiment has the four contact portions 48, center alignment for the wafer and measurement of the wafer outside diameter can be performed if at least three contact portions are provided. In other words, in the case where an object to be measured is wafer outside diameter, a center aligning unit including three or more contact portions can serve as the measuring means in the present invention.

In addition, the embodiments of the present invention are not limited to the above embodiment, and various changes, substitutions, and modifications may be made without departing from the gist of the technical thought of the present invention. Further, if the technical thought of the present invention can be embodied in other ways by the advance of technology or by another derived technology, the present invention may be carried out using the relevant method. Therefore, the appended claims cover all the embodiments that fall within the scope of the technical thought of the present invention.

For example, while the wafer processing apparatus 10 includes the rough grinding unit 22*a*, the finish grinding unit 22*b*, and the laser processing unit 22*c* as processing units in the above embodiment, the number of the plurality of processing units constituting the processing apparatus in the present invention and the combination of functions of the processing units are not limited to the above-mentioned. For instance, a polishing unit, an etching unit and the like can be included in the processing units of the processing apparatus.

As has been described above, the present invention has an advantageous effect such that a wafer can be processed appropriately and assuredly, without causing defective processing due to erroneous feeding to processing of a wafer not conforming to a processing condition, and the present invention is particularly useful when applied to a processing apparatus for simultaneously processing a variety of semiconductor wafers or optical device wafers.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a plurality of wafers comprising:

mounting a cassette accommodating a plurality of wafers into a cassette mounting unit, wherein the plurality of wafers are of multiple kinds with different characteristics;

providing a plurality of processing units, each configured and arranged to perform wafer processing;

providing a carrying-out unit configured to carry out each of the wafers from the cassette mounted on the cassette mount unit;

providing a carrying unit configured to carry the wafer carried out by the carrying-out unit;

wherein the plurality of processing units are disposed adjacently to the carrying unit and which individually apply different wafer processing to the wafer;

using a control unit to control each of the processing units, the control unit including a storage section preliminarily storing plurality of processing condition sets including a first processing condition set correspondingly to first wafer characteristics, appropriate for each of the processing units, including at least a first allowable range of wafer thickness, appropriate for each of the processing units, and a first allowable range of wafer outside diameter appropriate for each of the processing units and a second processing condition set correspondingly to second wafer characteristics, appropriate for each of the processing units, including at least a second allowable range of wafer thickness, appropriate for each of the processing units, and a second allowable range of wafer outside diameter appropriate for each of the processing units, wherein the first processing condition set also including a first wafer carrying route defining the order for the wafer to be carried between the plurality of processsing units to produce a first kind of device and the second processing condition set also including a second wafer carrying route defining the order for the wafer to be carried between the plurality of processing units to produce a second kind of device, wherein the first kind of device is different from the second kind of device;

determining the processing condition from the plurality of processing conditions for a wafer removed from the cassette, and using the carrying unit to move the wafers to a wafer testing unit which is disposed adjacently to the carrying unit and performing a test to determining whether or not the wafer carried by the carrying unit is a wafer corresponding to the determined processing condition, wherein the wafer testing unit includes a holding table for holding the wafer carried from the carrying unit, and measuring means for measuring the wafer characteristics of the wafer held by the holding table, measuring the wafer characteristics of the wafer held by the holding table with the measuring means to obtain actual measurements of the wafer;

comparing the actual measurements of the wafer characteristics measured by the measuring means with the allowable range for the wafer characteristics corresponding to the determined processing condition, to thereby determine whether or not the carried wafer is a wafer corresponding to the determined processing condition, by using a determining section of the control unit;

when it is determined by the determining section that the carried wafer is a wafer corresponding to the determined processing condition, carrying the wafer to the processing unit and processing the wafer according to the wafer carrying route of the determined processing condition, thereby the determining by the determining section is performed prior to processing of the wafer by the processing unit, whereas when it is determined by the determining section that the carried wafer is not a wafer corresponding to the determined processing condition, using a notifying means to create an error notification, and wherein said stored processing conditions relate to whether or not it is appropriate to process a wafer in a particular one of said processing units, and not whether or not the wafer is defective.

2. The processing method according to claim 1, wherein the wafer characteristics include any one of wafer outside diameter, wafer thickness, index size, and an alignment key pattern image.

3. The processing method according to claim 1, further comprising:

a mount table for mounting on an upper surface thereof the wafer carried by the carrying unit; and center aligning means for aligning a center of the wafer, the center aligning means having at least three contact portions movable in radial directions with the mount table as a center, wherein the center aligning means functions also as the wafer testing unit, and includes measuring means for measuring the wafer characteristics of the wafer mounted on the mount table, and the wafer mounted on the mount table undergoes center alignment by the contact portions, and the wafer characteristics are measured by the measuring means.

\* \* \* \* \*